United States Patent
Ben-Ezri

(10) Patent No.: US 6,925,589 B1
(45) Date of Patent: Aug. 2, 2005

(54) METHOD FOR TRANSLATING PHYSICAL CELL-COORDINATES OF A MEMORY PRODUCT TO N-DIMENSIONAL ADDRESSES

(75) Inventor: Daniel Ben-Ezri, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/488,865

(22) Filed: Jan. 21, 2000

Related U.S. Application Data

(63) Continuation-in-part of application No. 09/182,168, filed on Oct. 29, 1998, now abandoned.

(51) Int. Cl.[7] .............................................. G11R 31/28
(52) U.S. Cl. ...................... 714/724; 714/718; 711/202; 711/206
(58) Field of Search ................................ 714/724, 718, 714/723, 759, 58, 730; 711/202, 206, 200, 203, 6

(56) References Cited

U.S. PATENT DOCUMENTS

| | | | |
|---|---|---|---|
| 4,939,694 A | | 7/1990 | Eaton et al. |
| 5,233,614 A | | 8/1993 | Singh |
| 5,280,601 A | * | 1/1994 | Desai et al. ................. 711/5 |
| 5,293,612 A | * | 3/1994 | Shingai |
| 5,522,038 A | | 5/1996 | Lindsay et al. |
| 5,668,815 A | | 9/1997 | Gittinger et al. |
| 5,758,056 A | * | 5/1998 | Barr |
| 5,778,004 A | | 7/1998 | Jennion et al. |
| 6,381,668 B1 | * | 4/2002 | Lunteren ..................... 711/5 |

* cited by examiner

*Primary Examiner*—Phung My Chung
(74) *Attorney, Agent, or Firm*—McGinn & Gibb, PLLC; Richard M. Kotulak, Esq.

(57) ABSTRACT

A structure and method for translating address buffer coordinates for a device under test having two or more similar repeatable units. The method comprises identifying a repeatable unit of the repeatable units, preparing a look up table for translating buffer coordinates of a reference unit of the repeatable units and displacing information from the look up table to correspond to the repeatable units.

20 Claims, 7 Drawing Sheets

METHOD FOR TRANSLATING PHYSICAL CELL-COORDINATES OF A MEMORY PRODUCT TO N-DIMENSIONAL ADDRESSES

This application is a Continuation-in-part (CIP) of prior application Ser. No. 09/182,168 filed Oct. 29, 1998, now abandoned.

BACKGROUND OF THE INVENTION

1. Field of the Invention

The present invention generally relates to memory address translation and more particularly to an improved method for translating two-dimensional cell coordinates of a memory to n-dimensional physical addresses.

2. Description of the Related Art

In the random access memory (RAM) test world, one of the most important tools for viewing and characterizing the test results of the Device Under Test (DUT) is a system that identifies the defective bits shipped from the tester (a.k.a "failmap") in a buffer and displays the failmap on a monitor in a two-dimensional layout. Such a system is referred to herein as Real-Time-Display (RTD).

A real-time-display system, however, is expected to provide more than just displaying the (failed and non-failed) bits. It has to provide some visual cues about the location/identity of each and every bit that is investigated by the test person (hereafter referred to as "the user"), along with its buffer coordinate and physical address.

The buffer is regarded as a two-dimensional plane (although it is usually organized internally, in the test system, as a one-dimensional stream of bits) because the display, which is two-dimensional by nature, is considered to be a direct representation of the buffer contents. Therefore, a buffer coordinate is a set of two numbers (x, y), describing the bit's location in the buffer. Buffer coordinates give the user a general idea about the location of bits in the physical device under test (since the buffer layout attempts to be a one-to-one representation the DUT's physical layout), but what the user is really interested in is the physical address of a given bit.

A bit's physical address is most closely related to the bit's electrical address. That is, when accessing the bit from an external circuit, a row address and a column address are applied to the device under test's electrical pins and the bit's value is read from (or applied to, in the case of a memory write operation) one of a set of I/O pins. The row address, the column address and the I/O pin number define the bit's electrical address. The physical address is essentially the same thing as the electrical address, except that the physical address definition is more flexible. The bit's row is sometimes specified in terms of a row number or word-line. The bit's column—in terms of column number, column-select or bit-line. I/Os are also referred to as DQs. In addition, the user might be interested not only in these three attributes, but also a bank number, a segment number, a unit number, etc.

Since each device under test bit can be uniquely described by either a buffer coordinate or a physical address, each physical address corresponds to one and only one buffer coordinate—and vice versa. The process of deriving a physical address from a buffer coordinate is called "buffer to physical address translation" (hereafter referred to as simply "address translation").

Every memory product has its own (usually unique) address translation scheme. Therefore, in order for a real-time-display system to provide physical addresses for a particular device under test, the real-time-display system has to know how to perform that device under test's address translation from the buffer coordinates (which are always known, by definition).

An immediate and straightforward approach to provide that information to the real-time-display system would be to use a lookup table (LUT) or an array of look up tables that describe address translation for the entire device under test. But this approach is impractical, since it requires and consumes huge amounts of memory in the real-time-display's system controller.

In an exemplary conventional solution to the address translation problem in real-time-display systems, the real-time-display programmer receives from the users (verbally or on paper or both) a description of the physical addresses layout of the device under test to be supported. The programmer then finds and/or creates a pattern, a function or an algorithm that can translate every buffer coordinate to its corresponding physical address for that particular device under test. Conventionally, there were very few cases in which one such algorithm could describe two or more different memory products.

The programmer then implements the algorithm in a computer language, such as "C" (the language in which the real-time-display system's software is written), compiles it, integrates it into the real-time-display software and tests the "new" program. The programmer then installs/updates copy of the new version on each real-time-display system that is going to be used for testing that particular device under test. The real-time-display systems, on which the updated version is installed, are now ready to report physical addresses. However, if an error (or a minor inaccuracy) in the address translation has been detected by the users, the process needs to be repeated.

The existing solution has the following drawbacks. First, the system's software needs to be upgraded for every new memory product. The users completely depend on the test system's programmer to support the new product. This makes turn around time substantially longer than if the users could simply apply their knowledge directly to the program. Every such "product support code" is rarely re-used for another product since there isn't a concept or a unified approach for describing the device under test, thus forcing the programmer to re-invent/re-think a description/algorithm for every new product. Thus, the programmer needs to learn and know at least the address translation aspect of each and every product to be supported on the real-time-display. Further, modifying the system's software source code, compiling and linking it can introduce bugs to the entire real-time-display system—not only the address translation part.

Using the exemplary conventional solution described above, almost every real-time-display system is unique in the sense that it supports a different collection of memory products. This poses a configuration management problem for the installed base of a large number of systems. The present invention overcomes these disadvantages, as discussed below.

SUMMARY OF THE INVENTION

It is, therefore, an object of the present invention to provide a structure and method for translating address buffer coordinates for a device under test having two or more similar repeatable units. The method comprises identifying a repeatable unit of the repeatable units, preparing a look up table for translating buffer coordinates of a reference unit of the repeatable units, displacing information from the look up table to correspond to the repeatable units and modifying the result by a linear operation and/or a scalar translation table comprising key-value pairs.

The displacing process can include mirroring the information from the look up table to correspond to the repeatable units. The reference unit may be a smallest repeatable unit and the method can also include the processes of identifying a first level of repeatable units, having a size larger than the smallest repeatable unit, identifying a second level of repeatable units, having a size larger than the first level of repeatable units, and recursively displacing the information from the look up table to correspond respectively to the smallest repeatable units, the first level of repeatable units and second level of repeatable units.

The displacing process combined with the linear operation or a scalar translation table comprising key-value pairs comprises translating the buffer coordinates using one of the following functions $g(x,y)=A \cdot f(ax+b, cy+d)+B$; and $g(x,y)= MAP[f(ax+b, cy+d)]$, and/or a combination of both, wherein variable A comprises one of an amplification and pattern reversal value, variable B comprises a linear displacement of said information from said look up table, variable b comprises a horizontal displacement from said reference unit, variable d comprises a vertical displacement from said reference unit, variable a comprises horizontal mirroring, variable c comprises vertical mirroring, and MAP is a scalar translation table comprising key-value pairs.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

I. Initial Embodiments

Figure 1:
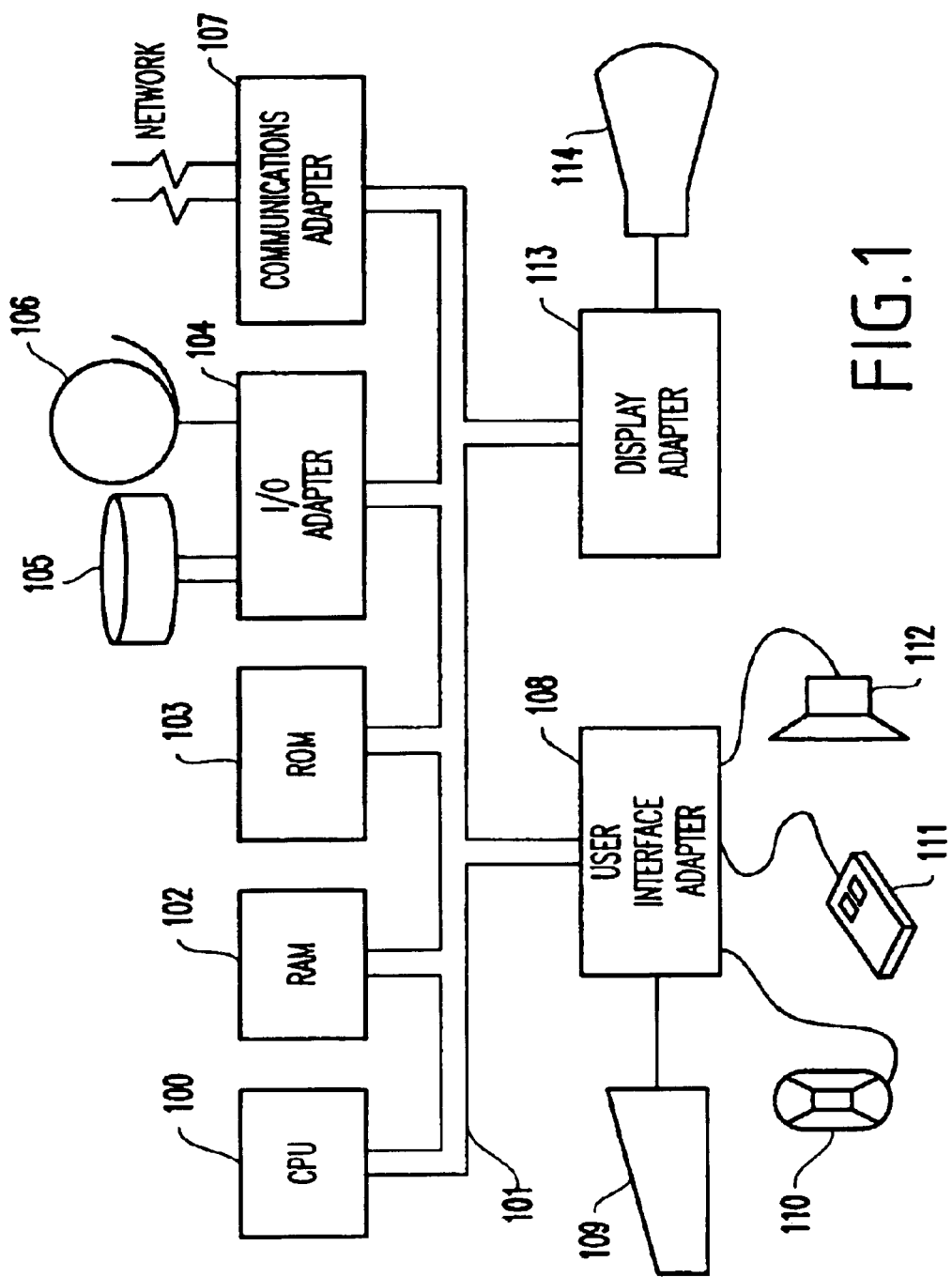
FIG. 1 is a schematic diagram of a computer system according to the invention.

The inventive address translation method enables the real-time-display system to be identical everywhere, yet be capable of supporting any device under test by letting the user describe the device under test's address translation directly to the system while the system is running, using a simple and concise Product Description Language (PDL) along with a mathematical model.

In real-time-display systems, there is a need to translate a two-dimensional coordinate (x,y) to an N-dimensional one (N=1, 2, 3, 4, . . . ):

$$(x,y) \rightarrow (x',y',z',w',v', \ldots) \qquad (1)$$

Where x', y' and z' correspond to bit-line, word-line and DQ, respectively. The other "dimensions" (e.g. w', v') can correspond to further partitioning such as segment number, unit number, "octant" and more.

The vector (x',y',z',w',v' . . . ) will be referred to herein as the translated coordinate, and the number of elements it contains as its dimension.

Such translation can be produced by an array of functions, as follows:

$$x'=f^x(x,y)$$
$$y'=f^y(x,y)$$
$$z'=f^z(x,y)$$
$$w'=f^w(x,y)$$
$$v'=f^v(x,y) \qquad (2)$$

which can also be described as a vector of functions (for shorter notation):

$$(x',y',z',w',v', \ldots )=\vec{F}\ (x,y) \qquad (3)$$

The foregoing should correctly translate the entire device under test area for any device under test.

For the sake of conciseness, any discussion herein of a memory product (or device under test) will refer only to its address-translation aspect. For example, "DUT description" as used herein is considered equivalent to "the DUT's address-translation description".

An ideal vector of functions would be such that each and every one of the functions is of a general analytic form that can describe any device under test, by simply having different sets of coefficients for different devices under test. For example, if x' could be described, for the entire device under test area, for any device under test as:

$$x'=ax+by+cx^2+d\ \sin(x \cdot y)+e \qquad (4)$$

then only the coefficients a, b, c, d and e need to be determined and entered into the real-time-display system. Additionally, such an ideal function would also allow the user to easily and methodologically find the coefficients for a given device under test.

In actuality, a vector of functions that can described the entire device under test area for any device under test is a vector of not-necessarily-linear, not necessarily-analytic functions. Therefor, a truly general implementation of such vector of translation function, could use a set of lookup tables (LUTs), one for each translated coordinate (x',y',z', w',v' . . . ), covering the entire device under test area. But this "technique" results in huge tables and is very tedious to the person who needs to build them and is, therefore, impractical.

An address-translation description method, which cannot be mathematically defined as based on the above definition of ideal vector of functions, but indirectly answers the core requirements of such a vector and that can describe the entire area of every memory product is shown in the following model:

The device under test consists of two or more rectangular blocks identical in their width and height. Each block is a simple permutation of any of the rest of the blocks, in the sense that its address-translation can be described as the other block's address-translation, modified by a linear operation on the original value in a corresponding coordinate in the reference block:

$$g(x,y)=A \cdot f(ax+b,\ cy+d)+B \qquad (5)$$

Where a, b, c, d, A and B are coefficients that are specific to each block and each translated coordinate component.

Note:

the above expression can intuitively be viewed as a combination of displacement, $g(x,y)=f(x+d_x, y+d_y)$ and mirroring, $g(x,y)+f(2m_x-x, 2m_y-y)$—modified by a linear operation, $A \cdot f + B$.

With the above model, if the user can describe the reference block, the user can describe the entire device under test by simply providing sets of the coefficients a, b, c, d, A and B—in addition to the reference block description. Describing the reference block is fundamentally the same as describing the entire device under test as discussed above, which previously could only be solved with extensive look up tables, except that the reference block with the above model is smaller than the device under test.

Such a reference block will be referred to herein as a repeatable unit or RU and a repeatable unit that cannot be further described by smaller RUs, using the above described model is defined herein as the smallest repeatable unit or SRU. For the sake of consistency and simplicity a reference block will always be a block that starts at buffer coordinate (0,0).

By partitioning the device under test into SRUs the above model can be extended beyond "ordinary" RUs. Empirically, a smallest repeatable unit is always much smaller in size than the device under test to which it belongs (in the order of 256×256 vs. 16384×16384 or even 16×512 vs. 16384× 65536). Therefore, a substantially smaller "SRU" lookup table (or a vector of look up tables) can be used to describe any smallest repeatable unit without incurring the excessive memory penalty discussed above with respect to conventional lookup tables.

In the foregoing model (e.g., equation 5) the x and y variables are supplied from the two-dimensional failmap. These are the buffer coordinates of the cell for which a physical address is desired. The coefficients "b" and "d", respectively, commonly represent the horizontal and vertical displacement of a given block from the reference block, but can have values other than the width and height of the reference block, respectively, when such degree of freedom can better serve the user of this inventive method.

The coefficients "a" and "c", respectively, represent horizontal and vertical mirroring and/or stretching of a given block from the reference block. If no mirroring is involved, then the coefficient value is a positive number. If a block is mirrored, then the coefficient value is negative. If no stretching is applied to the block then the coefficient value is either +1 or −1. A coefficient value other than +1 or −1 would stretch the block.

The coefficient A performs an "amplification" or "pattern reversal" operation or both. In most cases the value of A is either +1 or −1. However, this model does not restrict the value of A, when such degree of flexibility can better serve the user of this inventive method.

When A=+1 the function is not altered. Positive values other than +1, amplify the values obtained from the reference block. Negative numbers amplify and/or reverse numerical patterns in the block. The variable B represents the linear displacement of the values taken from the look up table within each of the blocks.

The SRU look up tables comprise a collection of two-dimensional matrices, such that:

$$(x',y',z',w',v',\ldots) = (l_{yx}^{x'}, l_{yx}^{y'}, l_{yx}^{z'}, l_{yx}^{w'}, l_{yx}^{v'}, \ldots) \quad (6)$$

for all $0<x<w$ and $0<y<h$. Where w, h are the width and height of the smallest repeatable unit, respectively; $l_{xy}^{x'}$ is the element at column x, row y in the matrix $[L^{x'}]$; and $[L^{x'}]$ is a matrix of dimension h×w, describing the x' component of the translated coordinate.

Or, in a shorter notation:

$$(x',y',z',w',v',\ldots) = \vec{T}_{yx} \quad (7)$$

The above vector of functions in equation 7 has the ability to practically describe any smallest repeatable unit. Therefore, equation 7 and the above model describe the entire device under test area in terms of the smallest repeatable unit. Equation 5 and the model can be used in a "flat" straightforward method, a recursive method or a combination of both.

The "Flat" (and straightforward) method includes processes of identifying a smallest repeatable unit (e.g., the top-left SRU), using a vector of n lookup tables (where "n" is the dimension of a translated coordinate) and describing the device under test as N×M smallest repeatable units (where N=W/w and M=H/h, W and H are the width and height of the DUT, respectively, and w and h are the width and height of the SRU, respectively).

The flat method has the advantage that it simply requires specifying N×M vectors, where each vector includes n sets of the 6 coefficients: a, b, c, d, A and B (each set of coefficients is not necessarily identical to any of the rest).

The disadvantage of the flat approach is that the user has to find (and enter) N×M×n sets of coefficients where each set has 6 coefficients. Therefore, if the smallest repeatable unit is small enough (a very desirable property), N×M could reach the order of hundreds of thousands. For example, a 1 Gb memory product with an 8 Kb SRU will have N×M=1 Gb/8 Kb=154,112. Referring to the same example, the variable "n" is usually at least 3, which would result in 462,336 sets of coefficients. Thus, the flat method is somewhat impractical.

The recursive method includes the following processes. First, a smallest repeatable unit (e.g., the top-left SRU) is identified using a vector of n lookup tables (where "n" is the dimension of a translated coordinate). A next-level repeatable unit, $RU_0$, is identified as $N_0 \times M_0$ smallest repeatable units (where $N_0=W_0/w$ and $M_0=H_0/h$). The variables $W_0$ and $H_0$ are the width and height of $RU_0$, respectively, and w and h are the width and height of the smallest repeatable unit, respectively. The $N_0 \times M_0$ vectors are then specified, again each vector includes n sets of 6 coefficients: a, b, c, d, A and B. Then, the next-level repeatable unit, $RU_1$ is identified as $N_1 \times M_1$ $RU_0$'s, using the same approach used to describe $RU_0$. This process is again repeated to describe $RU_2$ and so on, until the entire DUT is described as $N_i \times M_i$ of $RU_{i-1}$'s. The variables $N_0, N_1, \ldots, N_i$ and $M_0, M_1, \ldots, M_i$ must be natural numbers.

Because of its recursive nature, this approach requires many less sets of coefficients. The disadvantage is that the recursive method increases the difficulty of partitioning and sub-partitioning the device because there are multiple ways to recursively partition the device under test. However, the ability to partition the device under test in various ways actually increases the flexibility of the method. The recursive method is practical and can be implemented inexpensively.

The recursive partitioning and its advantage over the flat method will be further explained using the following exemplary 256 Mb device under test having a value of i (i.e. number of levels of repeatable units—exclusive of the smallest repeatable unit) equal to 5 (i=0 to 4). The layout/partitioning of the device under test is as follows. The DUT has 2 $RU_4$s; each $RU_4$ has 2 $RU_3$s; each $RU_3$ has 2 $RU_2$s; each $RU_2$ has 32 $RU_1$s; each $RU_1$ has 4 $RU_0$s; and each $RU_0$ has 4 SRUs.

This amounts to only 2+2+2+32+4+4=46 vectors of sets of coefficients. To the contrary, using the flat method, would require specifying 2·2·2·32·4·4=4096 vector of sets of coefficients.

Therefore, with the invention, every point (x,y) in an ith-level repeatable unit (except for the smallest repeatable unit) can be translated as follows:

$$f_i^x(x,y) = A_i^x \cdot f_{i-1}^x(a_i^x x + b_i^x, c_i^x y + d_i^x) + B_i^x$$

$$f_i^y(x,y) = A_i^y \cdot f_{i-1}^y(a_i^y x + b_i^y, c_i^y y + d_i^y) + B_i^y$$

$$f_i^z(x,y) = A_i^z \cdot f_{i-1}^z(a_i^z x + b_i^z, c_i^z y + d_i^z) + B_i^z$$

$$f_i^w(x,y) = A_i^w \cdot f_{i-1}^w(a_i^w x + b_i^w, c_i^w y + d_i^w) + B_i^w$$

$$f_i^V(x,y) = A_i^V \cdot f_{i-1}^V(a_i^V x + b_i^V, c_i^V y + d_i^V) + B_i^V \qquad (8)$$

Values must be assigned to a, b, c, d, A and B—for every level, i, and for every translated coordinate in the vector (x',y',z',w',v' ...). This is usually an intuitive and relatively easy task, especially when considering that the variable A has usually the value of 1 or −1; the variable a has usually the value of either 1 or −1. The variable c has usually the value of either 1 or −1; the variables b and d are usually proportional to the width and height of the repeatable unit, respectively. Thus, the main "challenge" for the user is to find the B coefficients.

The process for finding those sets of coefficients can include taking any 6 (x, y) points in the repeatable unit to be described, taking the corresponding points in the reference repeatable unit and assign them in the 6 equations of the form of equation 5; g(x,y)=A·f(ax+b, cy+d)+B. This results in a set of 6 equations of 6 variables which are solved by numerical analysis methods, for example, using a computer program.

With the following example shown in Table 1, a repeatable unit includes 4 smallest repeatable units and only one translated coordinate.

TABLE 1

| (0,0) | | | | (15,0) |
|---|---|---|---|---|
| 0, 0, 1, 1, 2, 2, 3, 3 | | | 15, 15, 14, 14, 13, 13, 12, 12 | |
| 4, 4, 5, 5, 6, 6, 7, 7 | | | 11, 11, 10, 10, 9, 9, 8, 8 | |
| 15, 15, 14, 14, 13, 13, 12, 12 | | | 0, 0, 1, 1, 2, 2, 3, 3 | |
| 11, 11, 10, 10, 9, 9, 8, 8 | | | 4, 4, 5, 5, 6, 6, 7, 7 | |
| (0,3) | | | | (15,3) |

The bottom-left quarter is mirrored twice—both in the X axis and in the Y axis. The numbers in the table represent one-dimension translated coordinate, although mirroring is not limited to one dimension because their values are dependent on both x and y.

The variable X is defined as the value derived from the look up table for the original smallest repeatable unit ("first level translation"). The variable $X^0$ is the value derived from (x, y) for the next level repeatable unit. The value $X^1$ is the value derived from (x, y) for the second level repeatable unit, and so on.

While any $X^0$ value, for every point (x,y), in the top-left repeatable unit is identical to X by definition—the $X^0$ value is determined according to the following functions in the other quarters (or RUs):

Bottom-left—$f_{x0}(x,y) = 1 \cdot f_x(7-x, 3-y) + 8$;
Top-right—$f_{x0}(x,y) = 1 \cdot f_x(15-x, 1-y) + 8$; and
Bottom-right—$fx0(x,y) = 1 \cdot f_x(x-8, y-2) + 0$.

While the mathematical methodology of the invention is described above, the invention can be embodied in any number of different types of systems and executed in any number of different ways, as would be known by one ordinarily skilled in the art. For example, as illustrated in FIG. 1, a typical hardware configuration of an information handling/computer system in accordance with the invention preferably has at least one processor or central processing unit (CPU) 100. The CPU 100 is interconnected via a system bus 101 to a random access memory (RAM) 102, read-only memory (ROM) 103, input/output (I/O) adapter 104 (for connecting peripheral devices such as disk units 105 and tape drives 106 to the bus 101), communication adapter 107 (for connecting an information handling system to a data processing network) user interface adapter 108 (for connecting a keyboard 109, microphone 110, mouse 111, speaker 112 and/or other user interface device to the bus 101), and display adapter 113 (for connecting the bus 101 to a display device 114).

Figure 2:
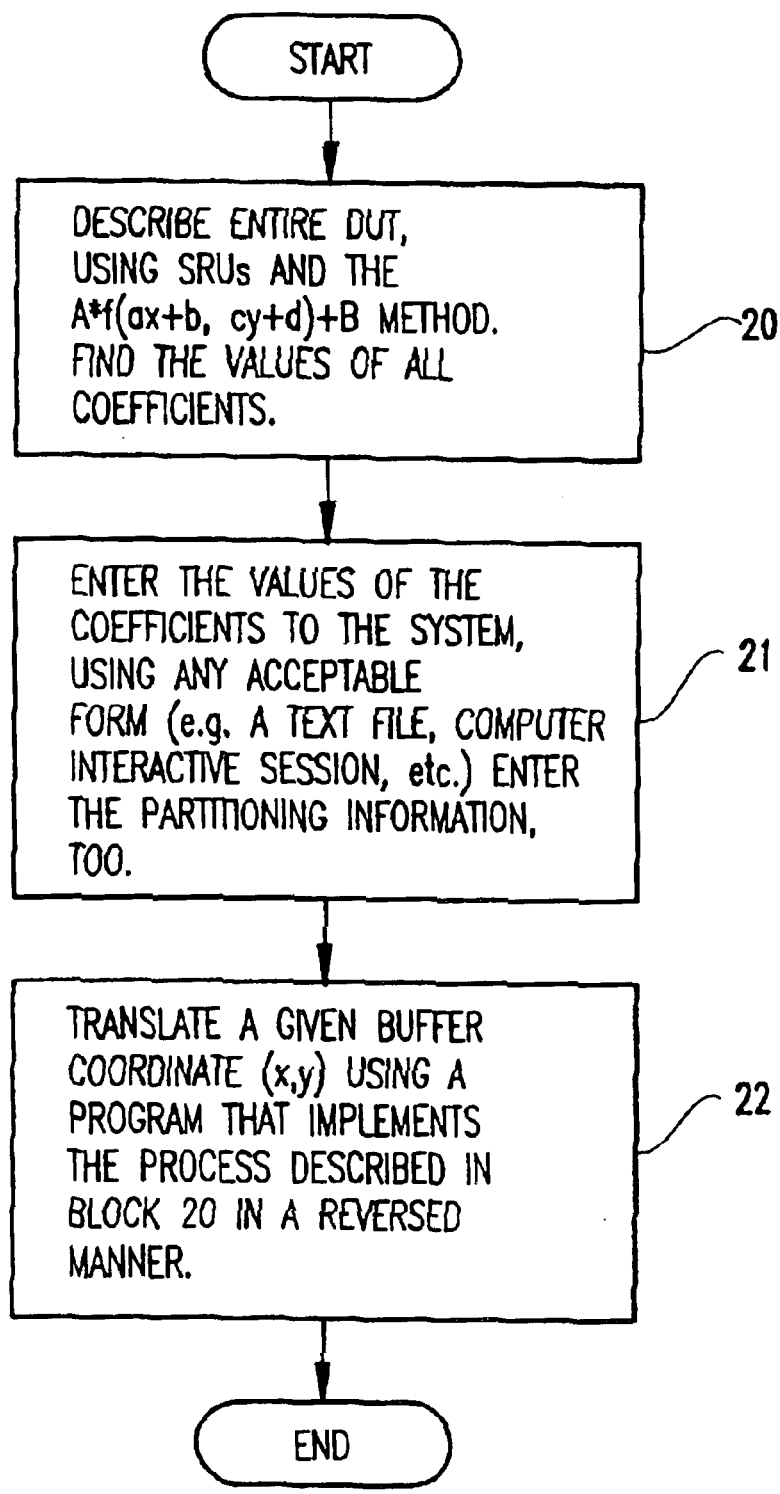
FIG. 2 is a flow diagram illustrating a preferred method of the invention.
Figure 3:
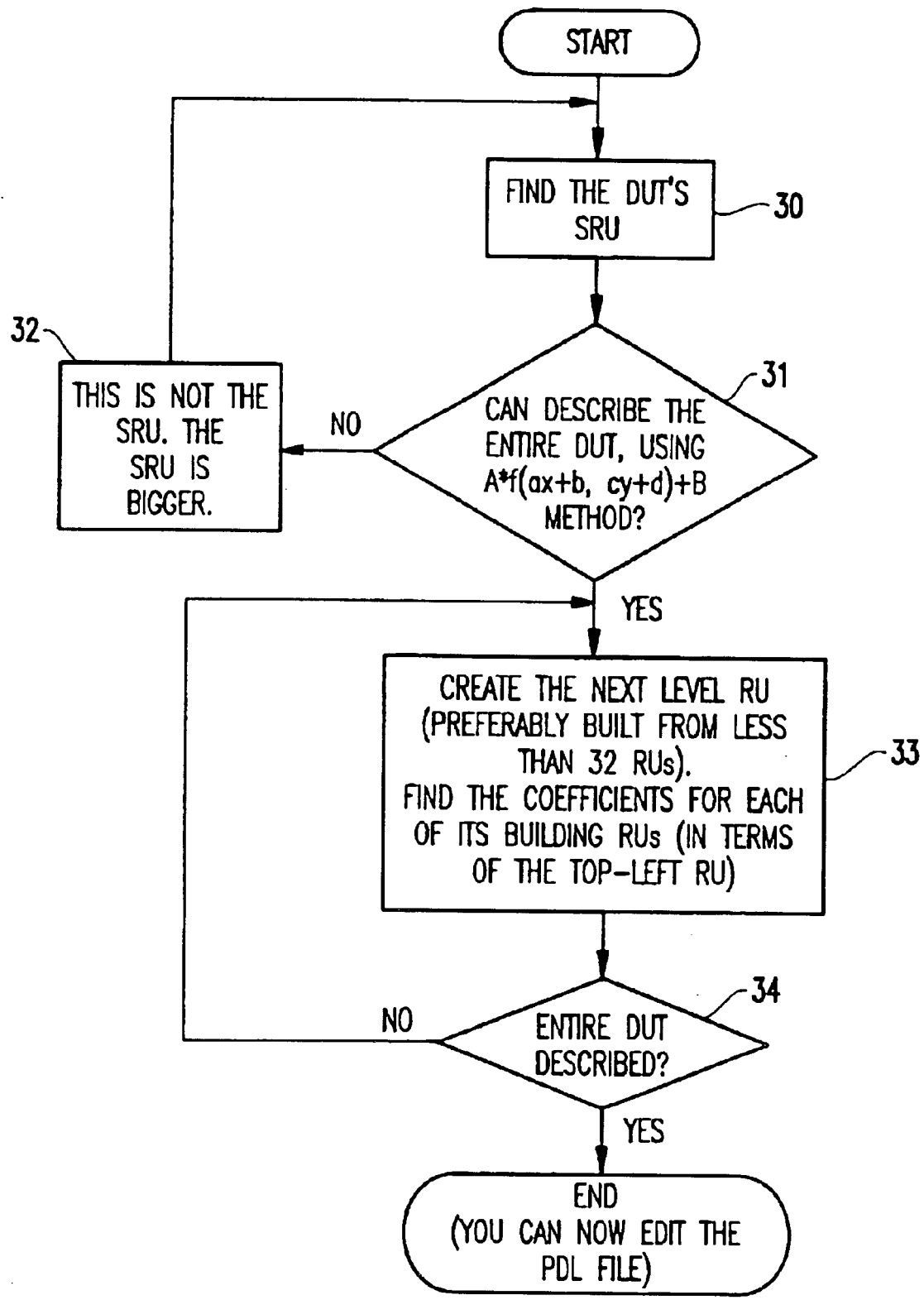
FIG. 3 is a flow diagram further detailing the process described in block 20 in FIG. 2.

FIG. 2 illustrates a flow chart of a method used for implementing the invention. The method includes 3 principle stages (blocks 20, 21, 22). The user (or a related professional) starts by describing the entire DUT using SRUs and the A*f(ax+b,cy+d)+B method, and finding the values of all coefficients in block 20. More specifically, in FIG. 3, the user finds the smallest repeatable unit of a device under test in block 30. Then, in block 31 a determination is made whether the entire device under test can be described using the A·f(ax+b, cy+d)+B method. If it cannot be described using the A·f(ax+b, cy+d)+B method, the repeatable unit is not the smallest repeatable unit and processing returns to block 30, as illustrated in block 32.

If the entire device under test can be described using the above method, processing proceeds to block 33 where the next level of repeatable unit is created (preferably from less than 32 repeatable units) and the coefficients for each of the repeatable units (in terms of the top-left repeatable unit) are found. In block 34, it is determined whether the entire device under test has been described. If it has not been described, processing returns to block 33. If it has been described, processing proceeds to the end where the product description language file (PDL) can be edited, or the newly found information can be entered to the system in any acceptable way.

Figure 4:
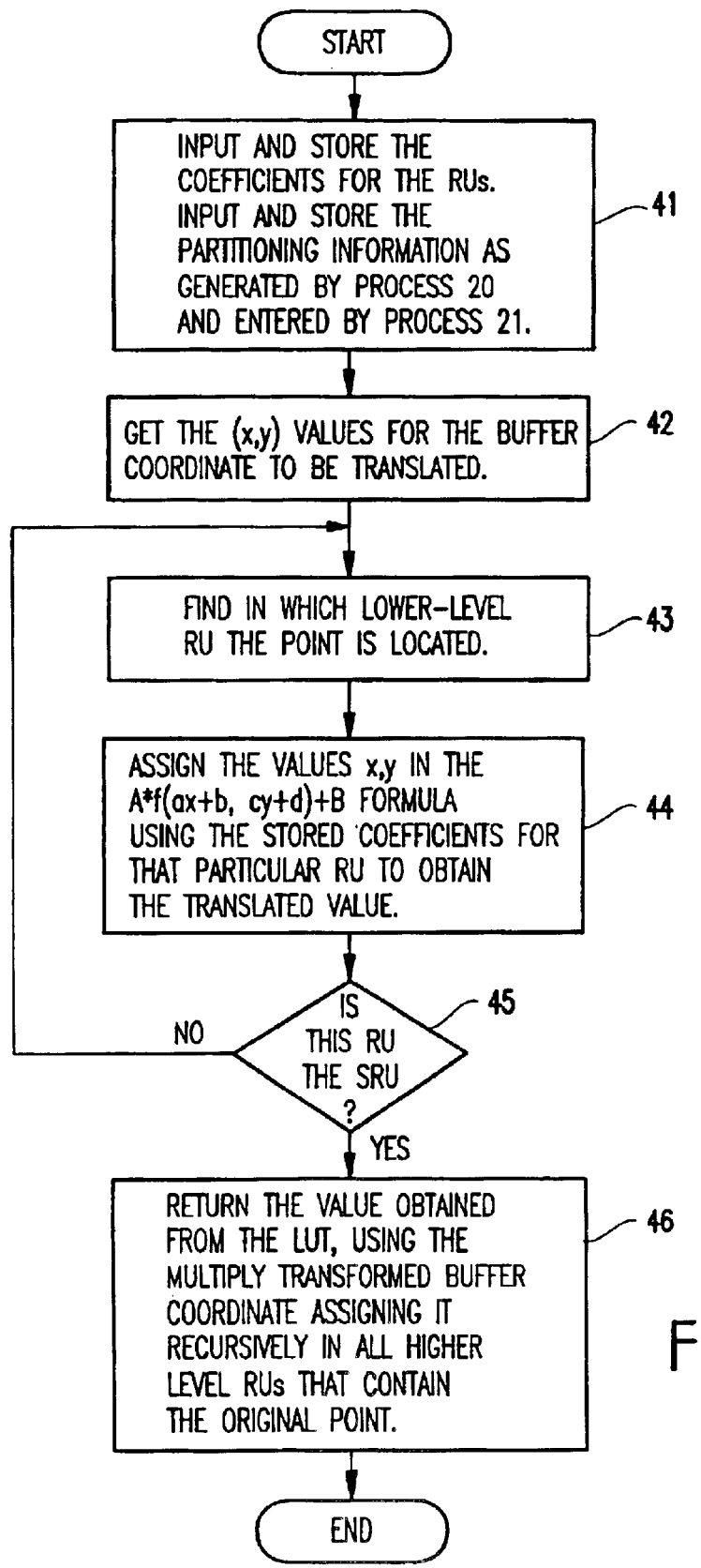
FIG. 4 is a flow diagram further detailing the process described in block 22 in FIG. 2.

FIG. 4 illustrates a flow chart of a software program for implementing the last stage of invention (as depicted in FIG. 2 block 22). More specifically, in FIG. 4, block 41, the computer program inputs and stores the coefficients for the RUs and the partitioning information generated in block 20 and entered in block 21. Then, in block 42 the program retrieves the x,y values for the buffer coordinate to be translated. Then in block 43 the program determines which next-lower-level RU contains the point to be translated. Then, in block 44 the program assigns the values x, y in the A*f(ax+b,cy+d)+B formula, using the stored coefficients for the particular RU to obtain the translated method. Then in block 45 a determination is made as to whether that RU is the SRU. If not, the processing goes back to block 43 to obtain the value from a further lower-level RU. When the programs finally gets to the SRU, in block 46 the program returns the value obtained from the LUT, using the multiply-transformed buffer coordinate and assigning it recursively in all levels of RUs that contain the original point. At this point the program is ready to display, store and/or output the newly translated value.

As would be known by one ordinarily skilled in the art given this disclosure, a computer program in any suitable language can be prepared to execute the invention. For example, to accomplish the step described in FIG. 2, block 21, the user could prepare the necessary information for the address translation by creating in a product description language (PDL) file, using any text editor. The format and grammar for such a file could, for example, have the following format:

Every translated coordinate (i.e. row, column, DQ, etc.) could be described in its own section. The section could start with the line:

<BUF2PHYS>coordinate-name and end with the line:

<END-BUF2PHYS> coordinate-name is the title that the user wants to be displayed on the RTD when reporting the value of the translated coordinate.

Following the start of the coordinate section, the smallest repeatable unit could be described with reference to a look up table. The smallest repeatable unit description has its own section (within the coordinate section), starting with the line:

<STARTLUT> and end with the line:

<ENDLUT>

Note:

At times, a smallest repeatable unit address-translation pattern is simple enough that it can be described using a relatively simple algebraic expression, thus saving the memory required for a look up table. Therefore, an alternative way for describing a smallest repeatable unit is as follows:

<STARTSRU>

S=expression

<ENDSRU> where expression is any mathematical expression that takes x and y as arguments (e.g. 3x+7−(y<<4)%5).

Following the start of the look up table section, the maximum value for the translated coordinate could be specified (this may be done to optimize memory use) in a separate line:

.MAXVALUE integer

In the next line, the look up table dimension could be specified: .LUTSIZE width×height Then, one or more lines that set the actual entries in the look up table, could take one of the following forms:

offset: (number, number, number, . . . ) x times op modifier which is interpreted as follows: "starting at offset offset in the array, set the numbers specified between the parenthesis and then repeat this process times−1 times, but each time modify the respective number by modifier, using the operator op". op can be any known algebraic operator (linear, Boolean and/or modulus) or offset: [src-offset, count] x times op modifier which is interpreted as follows: "copy to offset offset in the array count x (times−1) entries, each count entries being modified by modifier, using the operator op".

After the end of the smallest repeatable unit section, there can be any number of repeatable unit description statements. Each subsequent statement describes the next-level repeatable unit in terms of the already defined, one-level-lower repeatable unit. For example, the statements could take the following form:

$$Rj = \{[R_i(x, y)], \ldots , [A_{m0}R_i(a_{m0}x + b_{m0}, c_{m0}y + d_{m0}) + B_{m0}]\}$$

$$\{[A_{01}R_i(a_{01}x + b_{01}, c_{01}y + d_{01}) +$$

$$B_{01}], \ldots , [A_{ml}R_i(a_{ml}x + b_{ml}, c_{ml}y + d_{ml}) + B_{ml}]\}$$

$$\vdots$$

$$\{[A_{0n}R_i(a_{0n}x + b_{0n}, c_{0n}y + d_{0n}) +$$

$$B_{0n}], \ldots , [A_{mn}R_i(a_{mn}x + b_{mn}, c_{mn}y + d_{mn}) + B_{mn}]\};$$

A statement can span over multiple lines. In fact, there is no significance to line breaks—they are simply considered a space. A statement should start with the literal R (or DUT), followed a number and an equal sign (=), and it should end with a semicolon (;). A statement may include one or more rows, denoted by enclosing braces ({ . . . }). Every row should contain at least one term. A term must be enclosed by square brackets ([ . . . ]). The term defines a region in the current repeatable unit in terms of one-level-lower repeatable unit. The region is a rectangle, equal in width and height to the width and height of the reference repeatable unit. The region's position is determined by the term's position in the statement (therefore, it is preferable for the user to try to visually format a statement, to match the physical RUs organization). Each term should be of the form ARi (ax+b, cy+d)+B. The coefficients A, B, a, b, c and d are the same described in the mathematical model, above. The top-left term preferably has the coefficients always set to A=1, B=0, a=1, b=0, c=1, d=0, because the top-left repeatable unit is preferably the reference repeatable unit and is equal to itself, by definition. The last statement that appears in the coordinate section describes the entire device under test rectangle, regardless whether it starts with R or DUT, but for readability it is preferable to use the keyword DUT in the last statement (and only in the last statement).

As is customary in user-friendly text-based description languages, comments, comment lines and empty lines should be supported. Thus, anything that comes after a comment symbol (; or # or //) is simply ignored.

An exemplary product description language file for a device under test follows.

---

```
<BUF2PHYS> column // column (or x') LUT for the single SRU (256×256).
<STARTLUT>
.MAXVALUE 63
.LUTSIZE 256×256
0:      (0, 0, 0, 0) x64 +1
        [0, 256] x256 +0
<ENDLUT>
// RU0 is made out of 2×2 SRUs (no mirroring, just displacement).
```

-continued

```
// This makes RU0 of size 512x512=256K
R0 = {[S(x, y)]      [S(x-256,y)+256/4]}
        {[S(x, y-256)] [S(x-256, y-256)+256/4]};
//      RU1 is made out of 4x1 RU0s (no mirroring, just displacement).
//      This makes RU1 of size 2Kx512=1M
R1    ={[R0(x, y)] [R0(x-512, y)+512/4] (R0(x·2*512, y)+2*512/4]][R0(x-
3*512,y)+3*512/4]};
// RU2 is made Out of 2x16 RU1s - right half is mirror of left one
// This makes RU2 of size 4Kx8K=32M
R2=    {[R1 (x,y)]           [R1 (-x+4095, y)]}
       {[R1 (x,y-1*512)]     [R1 (-x+4095, y-1*512)]}
       {[R1 (x,y-2*512)]     [R1 (-x+4095, y-2*512)]}
       {[R1 (x,y-3*512)]     [R1 (-x+4095, y-3*512)]}
       {[R1 (x,y-4*512)]     [R1 (-x+4095, y-4*512)]}
       {[R1 (x,y-5*512)]     [R1 (-x+4095, y-5*512)]}
       {[R1 (x,y-6*512)]     [R1 (-x+4095, y-6*512)]}
       {[R1 (x,y-7*512)]     [R1 (-x+4095, y-7*512)]}
       {[R1 (x,y-8*512)]     [R1 (-x+4095, y-8*512)]}
       {[R1 (x,y-9*512)]     [R1 (-x+4095, y-9*512)]}
       {[R1 (x,y-10*512)]    [R1 (-x+4095, y-10*512)]}
       {[R1 (x,y-11*512)]    [R1 (-x+4095, y-11*512)]}
       {[R1 (x,y-12*512)]    [R1 (-x+4095, y-12*512)]}
       {[R1 (x,y-13*512)]    [R1 (-x+4095, y-13*512)]}
       {[R1 (x,y-14*512)]    [R1 (-x+4095, y-14*512)]}
       {[R1 (x,y-15*512)]    [R1 (-x+4095, y-15*512)]}
// RU3 is made out of 2x1 RU2s - the right half produced by a simple displacement
// This makes RU3 of size 8Kx8K=64M
R3= {[R2(x,y)] [R2(X-4096, y)]};
// RU4 is made out of 2x1 RU3s - the right half is a mirror of the left one.
// This makes RU4 of size 16Kx8K=128M
R4= {[R3(x,y)] [R3(-x+(16*1024-1), y)]};
// DUT is made out of 1x2 RU4S - the bottom half is a mirror of the top one.
// This makes DUT of size 16Kx16K=256M
DUT=    {[R4(x,y)]}
        {[R4(x, -y+16383)]};
<END-BUF2PHYS>
<BUF2PHYS> row // row (or y') LUT for the single SRU.
<STARTLUT>
.MAXVALUE 8191
.LUTSIZE 256x256
0:(8191)    x256
       [0, 2567x256 -1
<ENDLUT>
<END-BUF2PHYS>
<BUF2PHYS>DQ // DQ (or z') LUT for the single SRU. .MAXVALUE 4
.LUTSIZE 256x256
0:       (0,1,2,3) x64 +0
         (0, 256) x256 +0
<ENDLUT>
<END-BUF2PHYS>
```

Step 3 in the inventive method, as indicated in FIG. 2, block 22 and further described in FIG. 4 could be, for example, implemented in the C++ language, using an object oriented approach as follows

```
//////////////////////////////////////////////////////////////////
// this class represents a single RU term
// (the constants in: Af(ax+b, cy+d)+B)
class CRUTerm
{
private:
     long a, b, c, d, A, B;            // the famous RU coefficients.
public:
     CRect r;                          // bounds of RU rectangle in absolute coords.
     CRUTerm( );                       // constructor
     -CRUTerm( );                      // destructor
     int Parse(String& rExpr);         // knows how to translate a text string
// into coefficients.
     void GetCoefficients (int & ra, int & rc, int & rc, int & rd, int
& rA, int & rB) const;
};
//////////////////////////////////////////////////////////////////
// this class represents the SRU (implemented by either a LUT or a
```

-continued

```
// mathematical expression)
class CSRU
{
private:
    bool valid;             // either LUT or SRU exp has to be valid.
    int dataTypeSize;       // size (in bytes) of a LUT element.
    bool useLUT;            // tells whether use LUT or exp for SRU.
    void *pLUT;             // SRU: 2 dmnsnl packed-array byt ushorts, ulongs.
    CRect r;                // bounds of the RU rectangle in buffer coord.
public:
    CSRU( );                // constructor
    ~CSRU( );               // destructor
    int Parse (String& expr);   // know how to trans descrip txt into
//data members.
    ULONG GetPhysVal(ULONG x, ULONG y) const; // does actual address-
//translation
    int GetTb1ElemSize ( ) const { return dataTypeSize; };
    const CRect & Bounds( ) const {return r;);
};
////////////////////////////////////////////////////////////////
// this class represents a single RU (excluding the SRU)
class CRU
{
private:
    CArray aTerms;          // dynamic array of all terms describing
    RU(n) as func of RU(n-1).
    CRect r;                // bounds of the RU rect. in buffer coord.
public:
    CSRU *pSRU;             // only R0 will use this pointer.
    CRU *pPrev,             // ptr one-level-lower RU (def. current one).
    CRU( );                 // constructor
    ~CRU( );                // destructor
int Parse(String& expr); // knows how to translate txt string into terms.
ULONG GetPhysVal(ULONG x, ULONG y) const; // does actual address transl
const CRect& Bounds( ) const {return r;};
};
////////////////////////////////////////////////////////////////
//////////////
//  this class completely encapsulates a single physical coordinate
//  (e.g. column address, row address, DQ, etc.)
class CBufTOPhys
{
private:
    CSRU *pSRU;     // pointer to the SRU object.
    CArray aRU;     // array of arrays all RUs, including DUT, but
excluding SRU.
    public:
    String name;    // coordinate title.
    CBufToPhys( );  // Constructor
    ~BufToPhys( );  // destructor
int Parse(ifstream&); // knows how to trans coord sect. into CbufToPhys obj.
ULONG GetPhysVal(ULONG x, ULONG y) const; // does the actual address-
translation
};
```

Because of the recursive nature of this model, the real-time-display system software only needs to call the corresponding CbufToPhys object's member function GetPhysVal (x, y) in order to obtain the physical value of a given buffer coordinate (x, y). The function CbufToPhys::GetPhysVal (x, y) simply calls CRU::GetPhysVal (x, y), which recursively calls the one-level-lower object's CRu::GetPhysVal (x, y) and so on until the SRU's value is obtained and returned as follows:

```
ULONG CRU::GetPhysVal(ULONG x, ULONG y) const
{
CPoint pt(x,y); // simply convert (x,y) to CPoint for PtInRect( ).
int lastRow. = aTerms.GetUpperBound( );
int lastTerm;
CArray *pCurRow;
CRUTerm *PCurTerm;
```

```
int i, j;      // row and colwnn iterators, respectively
for (i=0; i<=lastRow; i++)
{
    pCurRow = (CArray *)aTerms[i];
    lastTerm = pCurRow->GetUpperBound( );
    for (j=0; j<=lastTerm; j++)
{
pCurTerm = (CRUTerm *) ((*pCurRow) [j]);
if (pCurTerm->r.PtInRect(pt))
{
    i = lastRow + 1; // just so that the outer loop will break, too.
    break;
        }
    }
}
int a, b, c, d, A, B;
pCurTerm->GetCoefficients(a, b, c, d, A, B);
```

```
if (pPrev == NULL)
    return A*(pSRU->GetPhysVal(a*x+b, c*y+d)) + B;
else
    return A*(pPrev->GetPhysVal(a*x+b, c*y+d)) + B;
}
```

Therefore, as shown above, a device under test (e.g., memory device) is tested for defects and a two-dimensional failmap is produced on a real time display. In order to identify the physical (electrical) location of a given defective element of the device under test, the two-dimensional coordinate of the failmap must be translated into an n-dimensional physical location (e.g., word-line, bit-line, DQ, etc.).

Conventionally, a programmer would prepare an algorithm or look up table relating to the entire device under test to perform the address translation. However, with the invention, the user (without the aid of a programmer) only needs to prepare a lookup table relating to the smallest repeatable unit of the device under test. In addition, the user supplies coefficients relating to linear operation on the lookup table values and horizontal and vertical mirroring and displacement from the reference block (as well as any additional required features) and the invention applies the look up table to all other smallest repeatable units to perform the address translation for the entire device under test. In addition, the recursive nature of the invention requires substantially reduced input from the user by defining larger and larger repeatable units.

Thus, with the invention, only sets of 6 coefficients and a look up table and the recursive partitioning information are required from the user and the assistance, design time, debugging time and other costs associated with conventional customized address translation programs are avoided.

Further, with the invention new products can be described and loaded to the system while the system is running and without rebooting it. Also, the process of finding and entering the information described above (coefficients, LUTs and partitioning) can be further automated, effectively reducing the time required to describe a product even more.

The invention is applicable to memory tests and memory design, any process, application or environment that requires translation of values obtained from a point located on 2-dimensional plane that have a repeatable pattern created by mirroring and/or displacement and/or linear operation. Even simple systems with N=1 (i.e. one dimension only) could benefit from the invention.

II. Additional Embodiments

While the foregoing translates buffer coordinates into physical addresses for all existing memory products, there are some intricate memory designs that force the user to either use larger than typical lookup tables and/or fewer than typical recursion levels. This generally results in larger than typical memory consumption and laborious user input.

An optimized solution to this problem is to describe—in selected recursion levels—repeatable units in terms of a reference repeatable unit, using the formula:

MAP[f(ax+b, cy+d)]

instead of:

A*f(ax+b, cy+d)+B

MAP is a scalar translation table comprising key-value pairs. Both the key and the value are integers. For example, if the expression f(ax+b, cy+d) for a reference repeatable unit can have only the following limited set of values: 12, 13, 14, 15, then a MAP for another repeatable unit in that recursion level could be as follows:

| 12 | 14 |
| 13 | 12 |
| 14 | 13 |
| 15 | 15 |

It is important to note that while it is possible to use the MAP formula in all recursion levels for a particular DUT type, or use the MAP formula in some recursion levels for all DUT types, it is generally not efficient to do so. In fact, for the vast majority of DUT types, using the A*f(ax+b, cy+d)+B formula exclusively is optimal. The MAP formula should be used sparingly, in cases where it is clear that such use will significantly reduce system memory use and/or the user input.

An example of this embodiment is a DUT of 32K×8K (256 MB) with the following DQ layout:

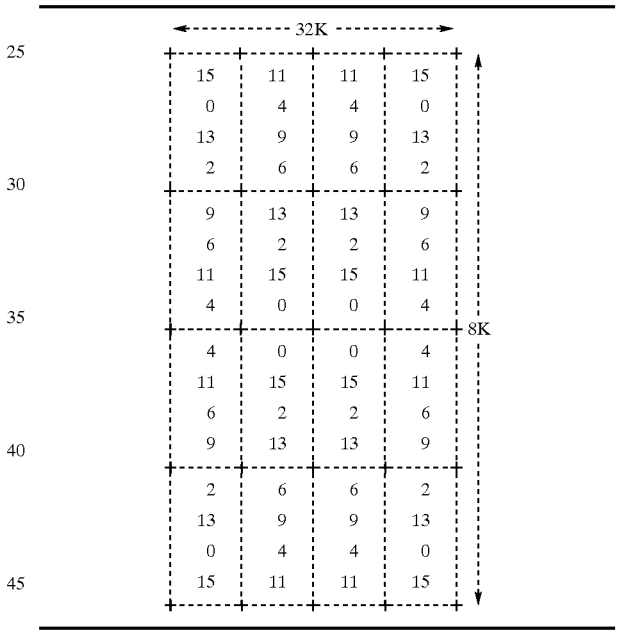

In this example, each set of 4 numbers enclosed represents a repeating pattern in the block enclosing it: In the top left block the first, fifth, ninth, etc. lines (512 such lines) have a DQ value of 15 (8192 such columns), the second, sixth, tenth, etc. (512 such lines) have a DQ value of 0 (8192 such columns), and so on.

Using the previous embodiment, the DQ address translation for the entire DUT involves only 3 recursion levels. A LUT of 16K×1 (16384×1):

```
<STARTLUT>
.MAXVALUE 15
.LUTSIZE 16384×1
0: (15) ×8192 0
   (11) ×8192 0
<ENDLUT>
```

RU0 which is made from 4096 LUTs vertically displaced into 16384×4096:

```
R0 =   {[S(x,       y-     0) -0]}
       {[S(-x+16383,y-     1)-11]}
       .
       .
       {[S(-x+16383,y-4094)  -0]}
       {[S (x,     y-4095) -11]};
```

(total of 4096 such lines)

And DUT, which is made from 4 RU0's displaced and mirrored about the x and y axis:

```
DUT=   {[R0(x,y)]}              [R0(-x+2*16384-1,y)]}
       {[R0(x,-y+2*4096-1)]     [R0(-x+2*16384-1,-y+2*4096-1)]};
```

RU0 is relatively huge (only a quarter of the entire DUT) and involves 4,096 different sets of coefficients.

However, in this embodiment, using the same LUT, much smaller RU's can be defined:

1) A LUT of 16K×1
2) RU0 is made from 4 LUTs (16384×1) vertically displaced into 16384×4.

```
R0 =   {[S(x,y)]}
       {[S(-x+16383, y-1) - 11]}
       {[S(x,      y-2) -2]}
       {[S(-x+16383, y-3) - 9]}
```

3) RU1 is made from 512 RU0's (16384×4) vertically displaced into 16384×2048.

```
RU1 =  {[R0(x,y)]}
       {[R0(x,y-4)]}
       {[R0(x,y-8)]}
       .
       .
       {[R0(x,y-2040)]}
       {[R0(x,y-2044)]}
```

4) RU2 is made from 2 RU1's (16384×2048) horizontally mirrored & displaced into 32K×2K.

```
RU2 = {[R1(x,y)]  [R1(-x+32767,y)]}
```

5) RU3 is made from 2 RU2's (32K×2K) vertically displaced into 32K×4K.

```
MAP3_0_1 = 15:9, 11:13, 0:6, 4:2, 13:11, 9:15, 2:4, 6:0
RU3 =  {[R2(x,y)]}
       {MAP3_0_1 [R0(x,y-2048)]}
```

6) DUT is made from 4 RU3's displaced and mirrored about the x & y axis

```
DUT=   {[R0(x,y)]              [R0(-x+2*16384-1,y)]}
       {[R0(x,-y+2*4096-1)]    [R0(-x+2*16384-1,-y+2*4096-1)]};
```

The first and last level are identical in both embodiments. The difference is two extra recursion levels that reduce the number of coefficients sets from 4096 to 4+512+2+2=520. In fact, because of the flexibility of the "MAP" embodiment it is possible to define an even smaller RU1 and recursively iterate to bigger RU's, resulting in less than 100 sets of coefficients. This saves both system memory and user input.

Figure 5:
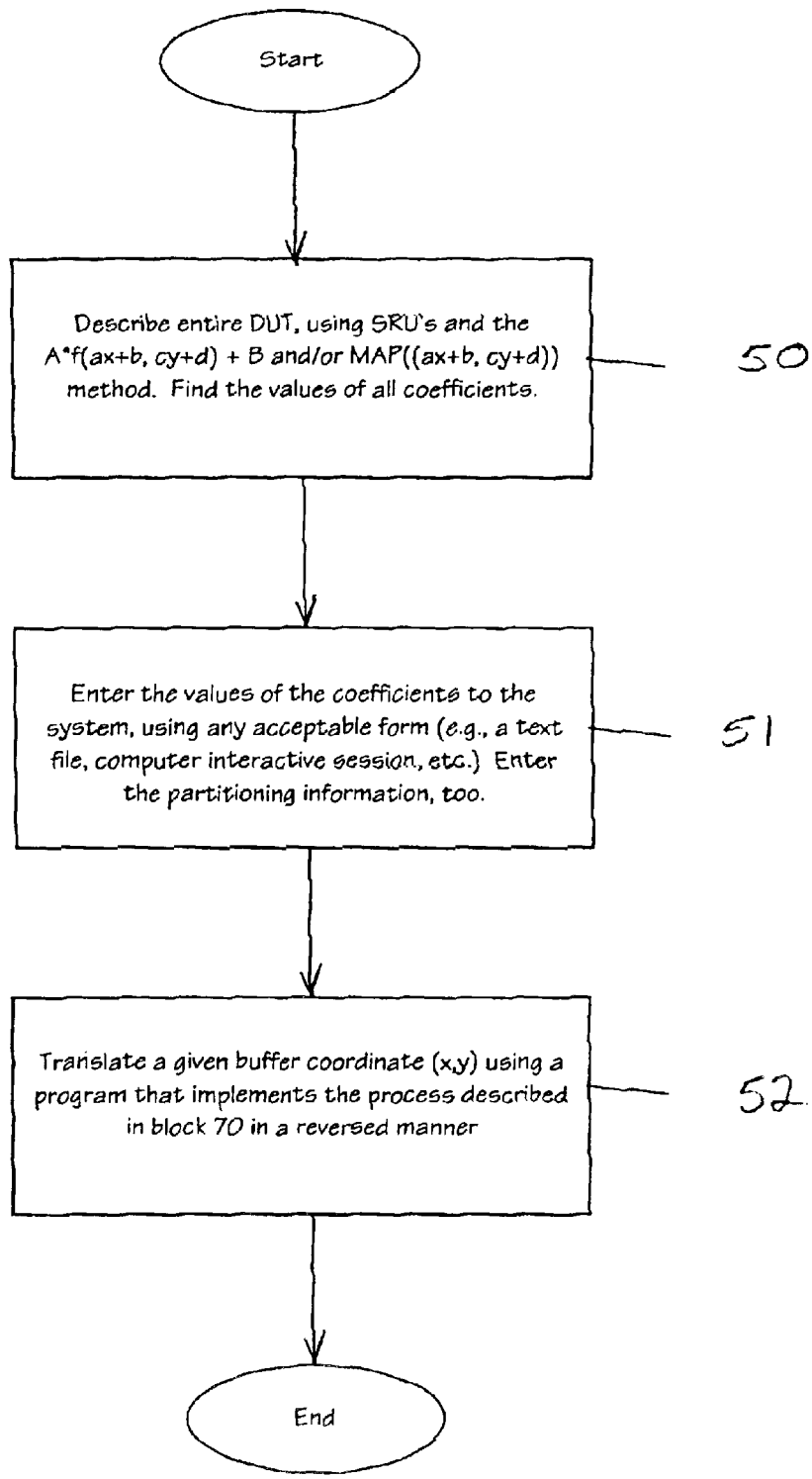
FIG. 5 is a flow diagram illustrating another embodiment of the invention.
Figure 6:
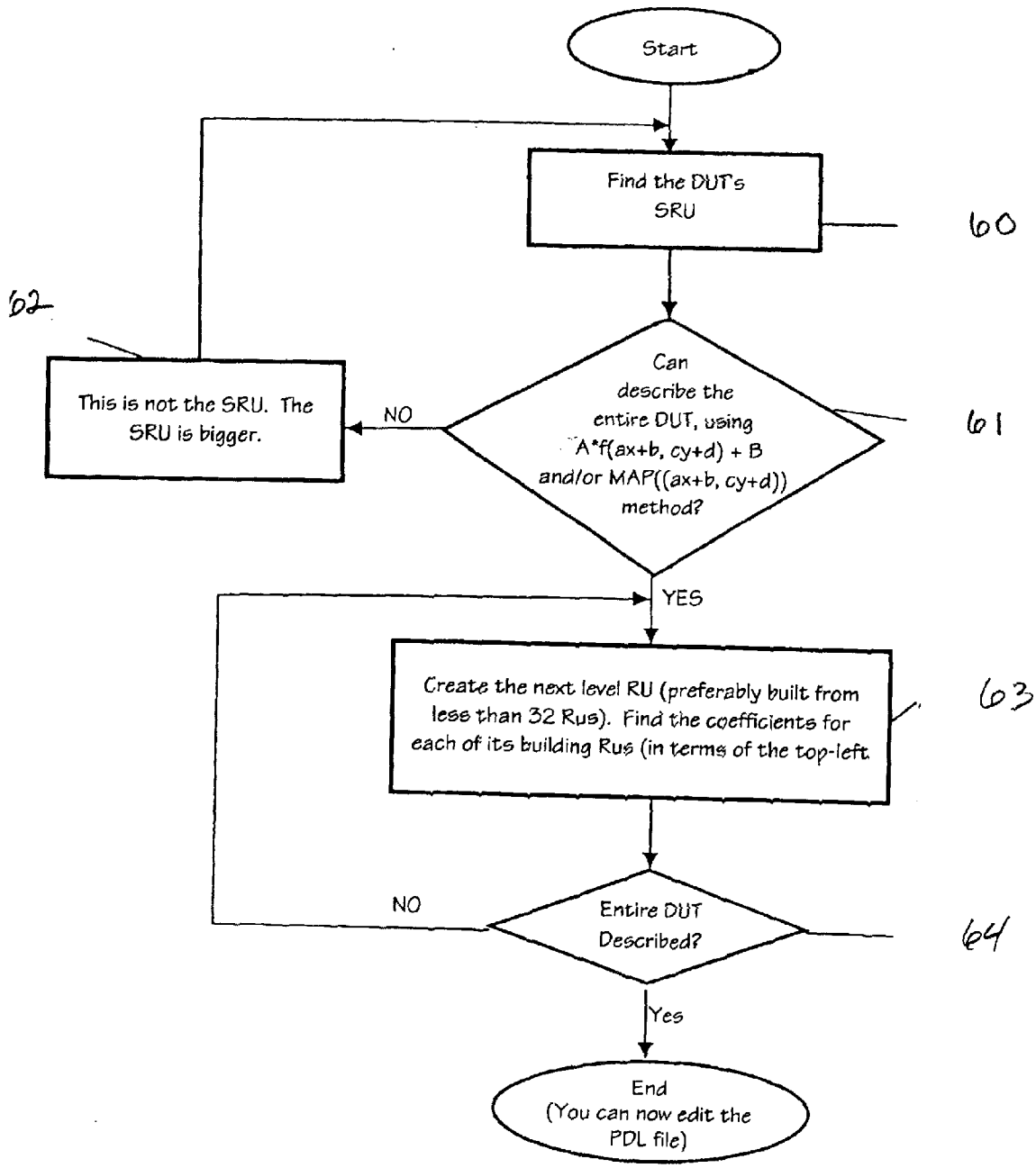
FIG. 6 is a flow diagram further detailing the process described in block 50 in FIG. 5.

FIG. 5 is a flow chart of a method used for implementing the invention and is similar to FIG. 2 except that the "MAP" embodiment is now illustrated. More specifically, this embodiment includes 3 principal stages (blocks 50, 51, 52). The user (or a related professional) starts by describing the entire DUT using SRUs and the A*f(ax+b,cy+d)+B and/or MAP((ax+b,cy+d)) method, and finding the values of all coefficients in block 50. More specifically, in FIG. 6 (which corresponds to FIG. 3), the user finds the smallest repeatable unit of a device under test in block 60. Then, in block 61 a determination is made whether the entire device under test can be described using the A*f(ax+b,cy+d)+B and/or MAP ((ax+b,cy+d)) method. If it cannot be described using the A*f(ax+b,cy+d)+B and/or MAP((ax+b,cy+d)) method, the repeatable unit is not the smallest repeatable unit and processing returns to block 60, as illustrated in block 62.

If the entire device under test can be described using the above method, processing proceeds to block 63 where the next level of repeatable unit is created (preferably from less than 62 repeatable units) and the coefficients for each of the repeatable units (in terms of the top-left repeatable unit) are found. In block 64, it is determined whether the entire device under test has been described. If it has not been described, processing returns to block 63. If it has been described, processing proceeds to the end where the product description language file (PDL) can be edited, or the newly found information can be entered to the system in any acceptable way.

Figure 7:
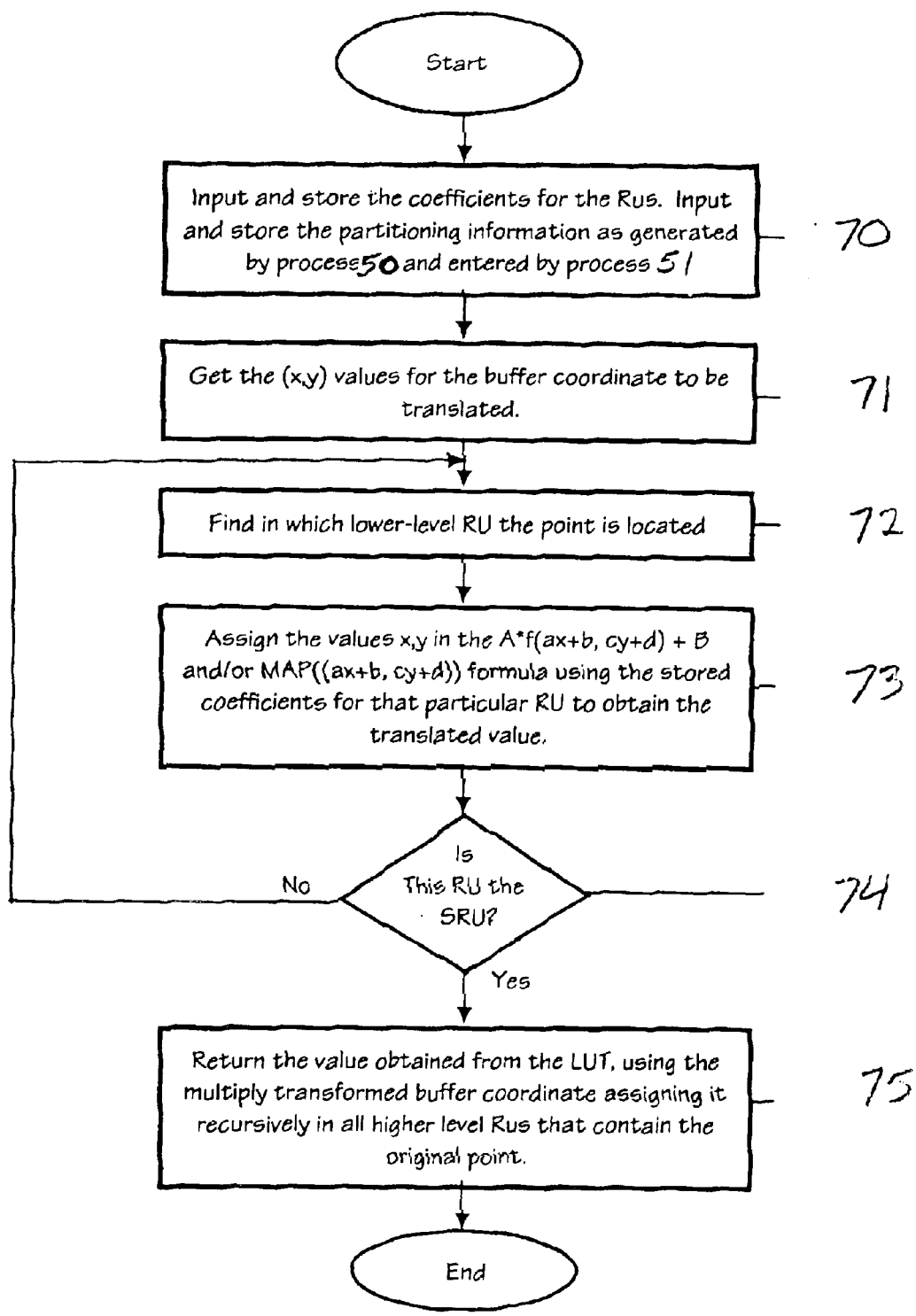
FIG. 7 is a flow diagram further detailing the process described in block 52 in FIG. 5.

FIG. 7 (which corresponds to FIG. 4) illustrates a flow chart of a software program for implementing the last stage of invention (as depicted in FIG. 5 block 52). More specifically, in FIG. 7, block 70, the computer program inputs and stores the coefficients for the RUs and the partitioning information generated in block 50 and entered in block 51. Then, in block 71 the program retrieves the x,y values for the buffer coordinate to be translated. Then in block 72 the program determines which next-lower-level RU contains the point to be translated. Then, in block 73 the program assigns the values x, y in the A*f(ax+b,cy+d)+B and/or MAP((ax+b,cy+d)) formula, using the stored coefficients for the particular RU to obtain the translated method. Then in block 74 a determination is made as to whether that RU is the SRU. If not, the processing goes back to block 72 to obtain the value from a further lower-level RU. When the programs finally gets to the SRU, in block 75 the program returns the value obtained from the LUT, using the multiply-transformed buffer coordinate and assigning it recursively in all levels of RUs that contain the original point. At this point the program is ready to display, store and/or output the newly translated value. Thus, the invention uses MAP(ax+b, cy+d) instead of A*f(ax+b, cy+d)+B, when it saves either system memory or user input or both.

While the invention has been described in terms of preferred embodiments, those skilled in the art will recognize that the invention can be practiced with modification within the spirit and scope of the appended claims.

I claim:

1. A method for determining the location of units on semiconductor devices comprising:
   determining the address of a unit; and
   determining the physical location of said unit by applying a set of displacement and mirror factors to the address.

2. The method in claim 1, wherein said address comprises a two-dimensional failmap address, said physical location comprises a n-dimensional electrical address of said failure location and n comprises a natural number.

3. The method in claim 1, further comprising:
   identifying repeatable units of said units;
   preparing a look up table for translating buffer coordinates of a reference unit of said repeatable units;
   displacing information from said look up table to correspond to said repeatable units; and modifying results of said displacing by a linear operation.

4. The method in claim 3, wherein said displacing includes mirroring said information from said look up table to correspond to said repeatable units.

5. The method in claim 3, wherein said reference unit comprises a smallest repeatable unit.

6. The method in claim 5, further comprising:
   identifying a first level of repeatable units, having a size larger than said smallest repeatable unit;
   identifying a second level of repeatable units, having a size larger than said first level of repeatable units; and
   recursively displacing said information from said look up table to correspond respectively to said smallest repeatable units, said first level of repeatable units and second level of repeatable units.

7. The method in claim 3 wherein said displacing and modifying comprise translating said buffer coordinates using the following function:

$$g(x,y)=A*f(ax+b,\ cy+d)+B;$$

wherein variable A comprises one of an amplification and pattern reversal value, variable B comprises a linear displacement of said information from said look up table, variable b comprises a horizontal displacement from said reference unit, variable d comprises a vertical displacement from said reference unit, variable a comprises horizontal mirroring and variable c comprises vertical mirroring.

8. A method for determining physical memory cell coordinates of a memory device, said method comprising:
   inputting a physical cell coordinate of a memory device; and
   applying a set of displacement and mirror factors to said physical cell coordinate to translate said physical cell coordinate into a logical address.

9. The method in claim 8, wherein said logical address comprises an N-dimensional logical address, wherein N comprises a natural number.

10. The method in claim 8, further comprising:
    identifying repeatable memory cells of said memory device;
    preparing a look up table for translating buffer coordinates of a reference memory cell of said repeatable memory cells;
    displacing information from said look up table to correspond to said repeatable memory cells; and
    modifying results of said displacing by a linear operation.

11. The method in claim 8, wherein said displacing includes mirroring said information from said look up table to correspond to said repeatable memory cells.

12. The method in claim 8, wherein said reference memory cell comprises a smallest repeatable memory cell.

13. The method in claim 12, further comprising:
    identifying a first level of repeatable memory cells, having a size larger than said smallest repeatable memory cell;
    identifying a second level of repeatable memory cells, having a size larger than said first level of repeatable memory cells; and
    recursively displacing said information from said look up table to correspond respectively to said smallest repeatable memory cells, said first level of repeatable memory cells, and second level of repeatable memory cells.

14. The method in claim 8, wherein said displacing and modifying comprise translating said buffer coordinates using the following function:

$$g(x,y)=A*f(ax+b,\ cy+d)+B;$$

wherein variable A comprises one of an amplification and pattern reversal value, variable B comprises a linear displacement of said information from said look up table, variable b comprises a horizontal displacement from said reference memory cell, variable d comprises a vertical displacement from said reference memory cell, variable a comprises horizontal mirroring and variable c comprises vertical mirroring.

15. A method for determining physical memory cell coordinates of a memory device, said method comprising:
    inputting a physical cell coordinate of a memory device; and
    applying a set of displacement and mirror factors to said physical cell coordinate to translate said physical cell coordinate into one of a logical address, an electrical address, and a structural address,
    wherein said logical address, said electrical address, and said structural address comprise N-dimensional addresses, and wherein N comprises a natural number.

16. The method in claim 15, further comprising modifying results of said applying by a linear operation.

17. The method in claim 15, wherein said applying includes mirroring information from a look up table to correspond to said memory cell coordinates.

18. The method in claim 15, wherein said memory cell coordinates comprises a smallest repeatable memory cell.

19. The method in claim 18, further comprising:
    identifying a first level of repeatable memory cells, having a size larger than said smallest repeatable memory cell;
    identifying a second level of repeatable memory cells, having a size larger than said first level of repeatable memory cells; and
    recursively displacing said information from a look up table to correspond respectively to said smallest repeatable memory cells, said first level of repeatable memory cells, and second level of repeatable memory cells.

20. The method in claim 15, wherein said applying comprise translating buffer coordinates using the following function:

$$g(x,y)=A*f(ax+b,\ cy+d)+B;$$

wherein variable A comprises one of an amplification and pattern reversal value, variable B comprises a linear displacement of said information from said look up table, variable b comprises a horizontal displacement from said reference memory cell, variable d comprises a vertical displacement from said reference memory cell, variable a comprises horizontal mirroring and variable c comprises vertical mirroring.

* * * * *